United States Patent
Goldberg et al.

(10) Patent No.: US 7,853,903 B1
(45) Date of Patent: Dec. 14, 2010

(54) METHOD AND MECHANISM FOR PERFORMING SIMULATION OFF RESOLUTION PROOF

(75) Inventors: Evgueni Goldberg, Berkeley, CA (US);
Felice Balarin, Berkelely, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 1097 days.

(21) Appl. No.: 11/397,230

(22) Filed: Apr. 3, 2006

(51) Int. Cl.
*G06F 17/50* (2006.01)

(52) U.S. Cl. .................. 716/4; 716/5; 703/14

(58) Field of Classification Search ........... 716/4–5; 703/13–15
See application file for complete search history.

(56) References Cited

U.S. PATENT DOCUMENTS

| | | | | |
|---|---|---|---|---|
| 5,617,510 | A | 4/1997 | Keyrouz et al. | 706/45 |
| 6,031,984 | A | 2/2000 | Walser | 703/2 |
| 6,247,164 | B1 | 6/2001 | Ashar et al. | |
| 6,816,825 | B1 * | 11/2004 | Ashar et al. | 703/14 |
| 6,912,700 | B1 | 6/2005 | Franco et al. | 716/5 |
| 7,596,770 | B1 * | 9/2009 | Kuehlmann et al. | 716/3 |
| 2001/0007970 | A1 * | 7/2001 | Kohno et al. | 702/117 |

OTHER PUBLICATIONS

Dantsin, E. et al. "A Deterministic (2-2/k+1)n Algorithm for k-SAT Based on Local Search", 2002, vol. 289, Issue 1, pp. 69-83, Essex UK.

Abramovici, M. et al. Digital Testing and Testable Design, Wiley-IEEE Press, Sep. 1994, Title page, Table of Contents and pp. 1-242.

Abramovici, M. et al. Digital Testing and Testable Design, Wiley-IEEE Press, Sep. 1994, pp. 243-455.

Baptista, L. et al.; "The Interplay of Randomization and Learning of Real-World Instances of Satisfiability", Proceedings of the AAAI Workshop on Leveraging Probability and Uncertainty in Computation, Jul. 2000, 4 pgs.

Bayardo, R. et al.; "Using CSP Look-Back Techniques to Solve Real-World SAT Instances" Proceedings of the 14th National Conference on Artificial Intelligence and 9th Innovative Applications of Artificial Intelligence Conference, 1997, pp. 203-208.

Ben-Sasson, E. et al. "Near-Optimal Separation of Treelike and General Resolution" Electronic Colloquium on Computational Complexity, Report No. 5 and Third Workshop on the Satisfiabiility Problem—May 2000, Jan. 17, 2000; pp. 1-17.

Biere, A., et al. "Symbolic Model Checking Using SAT Procedures Instead of BDDs", Proceedings of Design Automation Conference (DAC'99), 1999, pp. 317-320.

(Continued)

*Primary Examiner*—Paul Dinh
(74) *Attorney, Agent, or Firm*—Vista IP Law Group LLP

(57) ABSTRACT

An improved method and mechanism for verification of an electrical circuit design is provided. The method and system simultaneously provides the coverage advantage of formal verification with the scaling efficiencies of simulation. In one approach, the method and system generates an intelligent set of test vectors off a resolution proof. The intelligent set of test vectors can be used to simulate the circuit design for complete coverage without having to test the entire set of possible variable assignments for the CNF formula corresponding to the circuit design.

34 Claims, 5 Drawing Sheets

OTHER PUBLICATIONS

Brayton, R.K., et al. "Logic Minimization Algorithms for VLSI Synthesis", Kluwer Academic Publishers, Boston, MA, USA, 1984.

Burch, J. R., et al. "Tight Integration of Combination Verification Methods" k Proceedings of the International Conference on Computer-Aided Design, 1998, pp. 570-576.

Davis, M., et al. "A Machine Program for Theorem-Proving", Communications of the ACM, 1962, pp. 394-397.

Dubois, O., et al. "SAT versus UNSAT", Second DIMACS Series in Discrete Mathematics and Theoretical Computer Science, 1996, vol. 26, pp. 415-436.

Freeman, J.W. "Improvements to Propositional Satisfiability Search Algorithms" A Dissertation in Computer and Information Science, University of Pennsylvania, 1995.

Goldberg, E. et al; "Using SAT for Combinational Equivalence Checking" Proceedings of the Design Automation and Test in Europe Conference, 2001, pp. 114-121.

Goldberg, E. et al. "BerkMin: A Fast and Robust SAT-Solver" Proceedings of the design, Automation and Test in Europe Conference and Exhibition (DATE-2002) Paris, FR, Mar. 4-8, 2002, pp. 142-149.

Goldberg, E. "Testing Satisfiability of CNF Formulas by Computing a Stable Set of Points" Proceedings of the Conference Automated Deduction (CADE 2002) Copenhagen, DK, Jul. 27-30, 2002, vol. 2392, pp. 161-180.

Goldberg, E. "Testing Satisfiability of CNF Formulas by Computing a Stable Set of Points" Annals of Mathematics and Artificial Intelligence, Jan. 2005, vol. 43, Issue 1-4, pp. 65-89.

Goldberg, E. "Determinization of Resolution by an Algorithm Operating on Complete Assignments", SAT-2006, pp. 90-105.

Goldberg, E. "On Bridging Simulation and Formal Verification" Technical Report, University of California at Berkeley, Feb. 2007, CDNL-TR-2007-0212.

Gomes; C. P., et al. "Heavy-Tailed Distributions in Combinatorial Search", Principles and Practice of Constraint Programming (CP97), 1997, pp. 121-135.

Gomes, C. P., et al. "Boosting Combinatorial Search Through Randomization". Proceedings of the International Conference on Principles and Practice of Constraint Programming, 1998, pp. 431-437.

Li, C. M. "A Constraint-Based Approach to Narrow Search Trees for Satisfiability", Information Processing Letters 71, 1999, vol. 71, pp. 75-80.

Marques-Silva, J. P. et al. "GRASP: A New Search Algorithm for Satisfiability", The University of Michigan, Apr. 10, 1996; pp. 1-17, CSE-TR-292-96.

Marques-Silva, J. P. et al. "GRASP: A Search Algorithm for Propositional Satisfiability", IEEE Transactions on Computers, May 1999, vol. 48, No. 5, pp. 506-521.

Marques-Silva, J. "The Impact of Branching Heuristics in Propositional Satisfiability Algorithms", Proceedings of the 9th Portuguese Conference on Artificial Intelligence (EPIA) Sep. 1999, pp. 62-74.

Miroslav Velev's SAT Benchmarks, 3 pgs., located at: http://www.ece.cmu.edu/~mvelev/sat_benchmarks.html.

Moskewicz, M. W. et al. "Chaff: Engineering an Efficient SAT Solver", Proceedings of the 38th Design Automation Conference (DAC '01) 2001, pp. 530-535.

Novikov, Y. A. "Using Restarts When Solving SAT-Instances", Proceedings of the Fourth International Conference on Computer-Aided Design of Discrete Devices (CAD DD '01) 2001, vol. 3, pp. 166-174.

SATLIB—Benchmark Problems, 2004, located at: http://www.satlib.org/benchm.html.

The SAT-Ex site, 2004, located at: http://www.lri.fr/ ~simon/satex/satex.php3.

Selman, B. et al. "A New Method for Solving Hard Satisfiability Problems" The 10th National Conference on Artificial Intelligence (AAAI-92), San Jose, CA, Jul. 12-16, 1992, pp. 440-446.

Selman, B. et al. "Noise Strategies for Improving Local Search" The 12th National Conference on Artificial Intelligence (AAAI-94), Seattle, WA, Jul. 31-Aug. 4, 1994, pp. 337-343.

Selman, B. et al. "Generating Hard Satisfiability Problems" Artificial Intelligence, 1996, vol. 81, pp. 17-29.

Sentovich, E.M. et al. "SIS: A System for Sequential Circuit Synthesis" Technical Report, University of California at Berkeley, 1992. Memorandum No. UCB/ERL. M92/41.

Stephan, P., et al., "Combinational Test Generation Using Satisfiability", IEEE Transactions on Computer-Aided Design of Integrated Circuits and Systems, Sep. 1996, vol. 15, No. 9, pp. 1167-1176.

Velev, M. N., Curriculum Vitae, 2004, located at: http://www.ece.cmu.edu/~mvelev.

Zhang, H. "SATO; An Efficient Propositional Prover", Proceedings of the 14th International Conference on Automated Deduction (CADE-14), Jul. 1997, pp. 272-275.

* cited by examiner

METHOD AND MECHANISM FOR PERFORMING SIMULATION OFF RESOLUTION PROOF

COPYRIGHT NOTICE

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

BACKGROUND

The invention relates to technology for implementing electronic design automation tools, and in particular, design tools for performing simulation of electrical circuit designs.

An IC is a small electronic device typically formed from semiconductor material. Each IC contains a large number of electronic components that are wired together to create a self-contained circuit device. A single IC may include millions of individual devices, such as transistors, capacitors, and resistors, formed on a chip to perform desired functions.

Production of complex ICs is an intricate process that involves many steps. One of the first steps in producing an IC involves designing a virtual version of the IC using computer-aided design tools. The design of a virtual version of an IC can be broken down into three general areas: design definition, design verification, and design layout. IC design definition can be described at various levels of sophistication or detail. The levels of design sophistication include the functional level, also referred to as the register transfer level (RTL) or the architectural level; the logical level, also referred to as the gate level; and the transistor level, also referred to as the layout level.

Numerous approaches can be taken to perform design verification. Functional verification is an approach that verifies the functionality and operation of a circuit design. Two well known approaches to performing functional verification are circuit simulation and formal verification.

A circuit simulator is a software-driven system used to dynamically predict the behavior of electrical circuits or other physical systems. Given a description of a circuit and a stimulus, the simulator dynamically generates and outputs the response of the circuit to the stimulus. The stimulus includes "test vectors" that test the operation of the circuit design under a specified set of conditions. In conventional systems, random simulation is routinely used to verify the circuit design. Random simulation is generally based on the following three postulates: a) to prove that a design is correct by simulation one needs to test the design's behavior for all inputs; b) since the set of all inputs is huge, simulation cannot be complete; c) to increase the chances of hitting a bug one should "spray" test vectors more or less uniformly over the set of all possible inputs.

Formal verification is an algorithmic-based approach to logic verification that exhaustively proves functional properties about a design. Using a mathematical model of the circuit design, the formal verification process attempts to check that the circuit will properly function under all conditions.

Formal verification and simulation are the two extremes of functional verification. Formal verification guarantees that a property holds for all inputs but scales up poorly. In contrast, simulation scales up well but guarantees only that a property holds for the set of generated test inputs.

To address the flaws in circuit simulation, there are approaches to curb the "randomness" of generated tests. One method is to bias random values assigned to a particular variable. To introduce biases "dynamically", markov chains may be used. Another way to reduce randomness is to add to the design under test some constraints and require that every test vector satisfies the constraints. These constraints can be of different nature. For example, they may describe design's environment or specify some scenario under which the design needs to be tested. One significant problem with these approaches is that they cannot guarantee complete coverage of a particular part of the search space. Moreover, they are not very effective at taking into account design specifics and cannot be used to smoothly change the ratio of deterministic and random components of simulation.

Embodiments of the present invention are directed to an improved verification approach that simultaneously provides the coverage advantage of formal verification with the scaling efficiencies of simulation. Some embodiments of the invention provide a method and system for generating an "intelligent" set of test vectors off a resolution proof. The intelligent set of test vectors, which do not need to be random, can be used to simulate the circuit design with dramatically higher coverage.

DETAILED DESCRIPTION

An embodiment of the present invention provides a method and system for generating an "intelligent" set of test vectors off a resolution proof. The intelligent set of test vectors can be used to simulate the circuit design for dramatically higher coverage of the search space.

Figure 1:
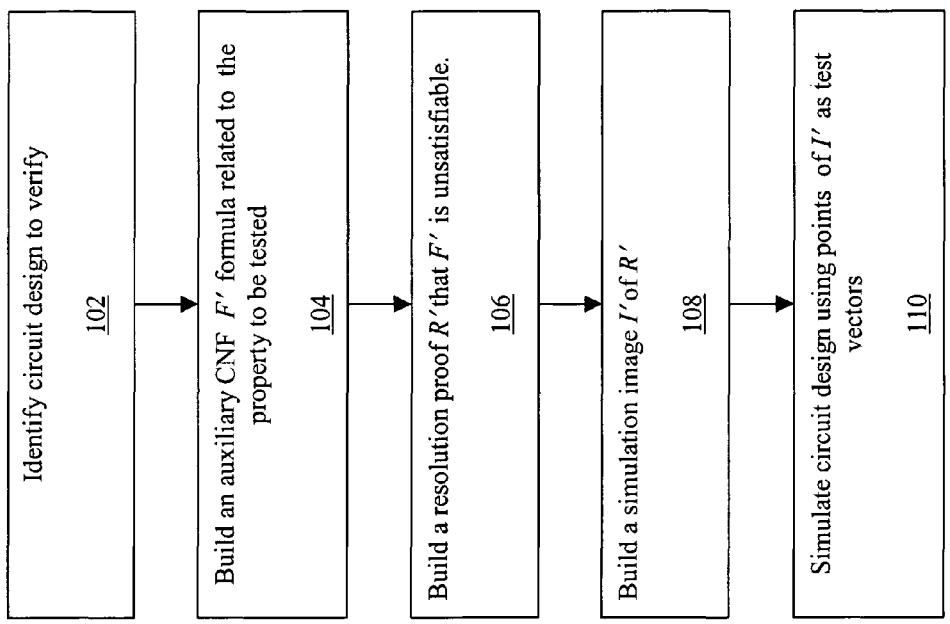
FIG. 1 illustrates a process for verifying a circuit design with resolution proof in accordance with some embodiments of the invention.

FIG. 1 is a flowchart showing an improved process for verifying a circuit design according to some embodiments of the invention. At 102, an identification is made of the circuit design to be verified. Any suitable approach can be taken to generate and identify the subject circuit design. The circuit design may be in any appropriate design format, including for example, Verilog and VHDL.

At 104, a CNF formula F' related to the property to be tested is generated. This formula is assumed to be unsatisfiable. At 106, a resolution proof of unsatisfiability of F' is generated by a SAT-solver. At 108, a simulation image I' of R' is generated. Such an image can be generated by one of the procedure described in this invention. At 110, the circuit is simulated using points of I' as test vectors.

The resolution proof system will now be described. A CNF formula F comprises a conjunction of clauses, with each clause comprising a disjunction of literals. A satisfiability problem (SAT) is to find a complete assignment p (called a satisfying assignment) to the variables of X such that $F(p)=1$ or to prove that such an assignment does not exist. If F has a satisfying assignment, then F is called satisfiable. Otherwise, F is unsatisfiable. A complete assignment to variables of X is further referred to as a point of the Boolean space $B^{|X|}$ where $B=\{0,1\}$. A point p satisfies clause C if $C(p)=1$. If $C(p)=0$, p is said to falsify C.

Assume that $C_1$ and $C_2$ are two clauses that have opposite literals of a variable $x_i$. The clause having all the literals of $C_1, C_2$ except those of $x_i$ is called the resolvent of $C_1, C_2$. For example if $C_1=x_1+x_3+x_5$, $C_2=x_2+\sim x_3+x_7$, the resolvent of $C_1$ and $C_2$ is the clause $x_1+x_5+x_2+x_7$ (here, symbol '+' denotes disjunction and symbol '$\sim$' denotes negation). The resolvent of $C_1, C_2$ is said to be obtained by the resolution operation. The resolution operation is complete. That is, given an unsatisfiable CNF formula F, one can always generate a sequence of resolution operations resulting in producing an empty clause. This sequence of operations is called a resolution proof. Since the resolvent of $C_1, C_2$ is implied by $C_1 \char`\^ C_2$, derivation of an empty clause from clauses of F means that F implies an empty clause and so F is unsatisfiable. An example of a SAT-solver that is based upon resolution is described in E. Goldberg, Y. Novikov, "BerkMin: a Fast and Robust SAT-solver", DATE-2002, Paris, pp. 142-149, which is hereby incorporated by reference in its entirety.

Figure 3:
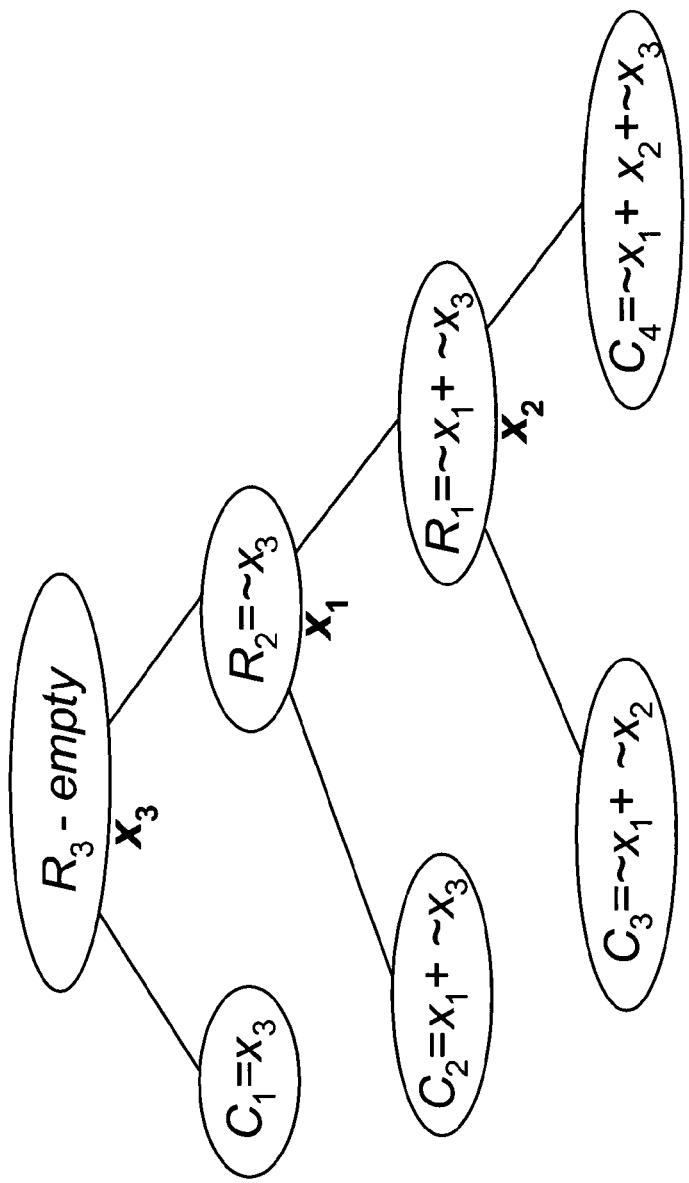
FIG. 3 illustrates an example resolution graph.

Referring to FIG. 3, shown is an example resolution graph. Assume that F is a CNF formula of three variables and four clauses: $C_1=x_3$, $C_2=x_1+\sim x_3$, $C_3=\sim x_1+\sim_2$, $C_4=x_1+\sim x_2+\sim x_3$. Here, clauses $R_1, R_2, R_3$ are resolvents. For instance, clause $R_1$ is obtained by resolving clauses $C_3$ and $C_4$ in variable $x_2$ that is shown under the corresponding node. The final resolvent $R_3$ is empty. That is it does not contain literals and so, can not be satisfied. The derivation of an empty clause proves that the original CNF formula F is unsatisfiable.

Simulation Image

The concept of a simulation image of a resolution operation and that of a resolution proof are useful in embodiments of the invention. Assume that $C_1$ and $C_2$ are two clauses that can be resolved in variable $x_i$. Further assume that $p_1$ and $p_2$ are two points that satisfy the following two conditions: 1) $C_1(p_1)=0$, $C_2(p_2)=0$; and 2) $C_1(p'_2)=0$, $C_2(p'_1)=0$ where $p'_1$ and $p'_2$ are obtained from $p_1$ and $p_2$ respectively by flipping the value of variable $x_i$.

The set $\{p_1, p_2\}$ is called a simulation image of the resolution operation over clauses $C_1, C_2$. Let R be a resolution proof that a CNF formula F is unsatisfiable. Let R consist of k resolution operations and $I_m$, $m=1, \ldots, k$ be a simulation image of m-th resolution operation of R. Then, the union $I_1 \cup \ldots \cup I_k$ is a simulation image I(R) of proof R. In general, a resolution operation has many simulation images. Hence, a resolution proof may have many simulation images.

The importance of the notion of simulation image is as follows. If a CNF formula evaluates to 0 at a set of points, forming an image I(R) of a resolution proof R, then F is unsatisfiable. It means that one can make simulation complete by testing the value of F at a set of points whose size is negligible in comparison to the size of the entire search space. One reason for such a dramatic reduction in the number of simulation vectors to be generated is because the test vectors are not randomly selected. Instead, test vectors (points) of a simulation image of a resolution proof are tightly related to each other. New test vectors are generated based on the results of the previous tests. This is in contrast to conventional approaches that randomly select test vectors, in which each new test vector is built "independently" of the results of the previous tests.

The following pseudocode describes a procedure (Find_proof_image$_1$), which, given a resolution proof R that a CNF formula F is unsatisfiable, returns a simulation image I(R) of R.

1 //R—resolution proof, F—CNF formula

2 //I(R)—simulation image of R

3 Find_proof_image$_1$(R,F)

4 {(R)←Ø;

5 repeat

6 {(C',C")←pick_resolution_operation(R,F);

7 (p',p")←find_operation_image(C',C");

8 I(R)←I(R) Ø {p', p"};

9 }

10 until {simulation image is build for every resolution operation}

11 return(I(R));

12 }

Find_proof_image$_1$ builds a simulation image of a resolution operation of R in the "repeat" loop (lines 5-10). Then, this simulation image is added to the current set I(R) (line 8) that is initially empty (line 4). After all resolution operations of R are processed, the final set I(R) is returned as a result (line 11).

The following pseudocode describes an alternate example procedure (Find_proof_image$_2$) for building a simulation image of a proof:

//R—resolution proof, F—CNF formula

//I(R)—simulation image of R. Initially I(R) is empty

//Clause—the clause of proof R to be processed. Initially Clause is an empty clause //Assgns—set of assignments made on the current path. Initially Assgns is empty.

1 Find_proof_image$_2$(R,F,I(R),Clause,Assgns){

2 if (Original_clause(Clause)){

3 I(R)←I(R) Ø vector(Assgns);

4 mark_as_fnished(Clause);

5 return; }

6 if (finished(Clause) return;

7 (C',C",$x_i$)←extract_parent_clauses(R, Clause);

8 if ($x_i$ is not assigned yet){

9 Find_proof_image$_2$(R,F, I(R),C', Assgns Ø ($x_i$=0));

10 Find_proof_image$_2$(R,F, I(R),C", Assgns Ø ($x_i$=1)); }

11 else //$x_i$ is assigned 12 if ($x_i$=0) Find_proof_image$_2$(R,F, I(R),C', Assgns);

13 else Find_proof_image$_2$(R,F, I(R),C", Assgns);

14 if (finished(C') and finished(C")) mark_as_fnished (Clause);

In contrast to Find_proof image$_1$ this procedure attempts to minimize the size of simulation image. The Find_proof image$_2$ procedure recursively traverses subgraph of R whose sink node corresponds to clause Clause. Initially Clause is equal an empty clause (the sink node of R). If Clause is a clause of the original formula, then the set of accumulated assignments is added as a new point of simulation image I(R), the node corresponding to Clause is marked as finished and this activation of Find_proof_image$_2$ terminates (lines 2-5). Initially I(R) is empty.

If the node of R corresponding to Clause is marked as finished, then the current activation of Find_proof image$_2$ terminates. If a node of R is marked as "finished," this means that a simulation image have been already built for the subgraph of R in which this node is the sink.

Otherwise, parent clauses C',C" of Clause and variable $x_i$ in which they were resolved are extracted from R (line 7). Suppose, for the sake of clarity, that C',C" contain positive and negative literals of $x_i$ respectively. If the variable $x_i$ is not assigned yet, then Find_proof_image$_2$ calls itself recursively twice (lines 9-10). In the first call, Clause is equal to C' and Assgns is extended by the assignment $x_i=0$. In the second call, Clause is equal to C" and Assgns is extended by the assignment $x_i=1$.

If $x_i$ has been already assigned, then only one recursive call of Find_proof image$_2$ is performed depending on the value of $x_i$ (lines 12-13). Finally, if the nodes corresponding to the parent clauses C' and C" are marked as finished, then the node corresponding to Clause is marked as finished as well.

Interpretation of a Simulation Image as a Set of Test Vectors

A simulation image of a resolution proof can be viewed as test vectors. To explain, let ξ a property of a circuit N to be tested. Typically, a test vector x is an assignment to input variables of N. During the simulation phase, internal variables of N (whose values are implied by x) are computed until the required output variables of N are assigned. Finally, it is checked if values taken by the required output variables of N satisfy the property ξ.

Let F(X,Z) be a CNF formula describing the ξ property of the circuit N. Here, X and Z are sets of variables corresponding to the input and internal+output variables of N respectively. In functional verification, one deals with a software model of circuit N. So any variable of N (and hence F) can be set to an arbitrary value. Formula F can be represented as $F_1 \hat{\ } F_2$ where $F_1$ specifies the functionality of N and $F_2$ encodes the property ξ. In terms of SAT, "regular" simulation can be described as making an assignment x to variables of X, computing the values of implied variables of Z and checking if $F_2$ is falsified. If it is, then ξ holds for the assignment x.

Let R be a resolution proof that F is unsatisfiable and I be a simulation image of R. Let p', p" be a simulation image of the resolution operation of R over clauses C',C" where C'(p')=0, C"(p")=0. One can view p" as a vector testing a property specified by the formula C'^C". Here, C'can be viewed as a "projection" of $F_1$ and C" as a "projection" of $F_2$. Indeed, after setting to 0 all the literals of C' while leaving the variable $x_i$ unassigned, one can deduce the value of $x_i$ (as the only value that satisfies C'). These are exactly the assignments to variables of C' that vector p" has. So, the "simulation part" of the test performed by p" is very short and consists of deducing from C' only one value, namely the value of $x_i$. On the other hand, since p" falsifies C", the "projection" of $F_2$ (and hence the "projection" of ξ) represented by C" holds. Analogously, p' can be viewed as a test for a property specified by the same formula C'^C" but now C' and C" are "projections" of formulas $F_2$ and $F_1$ respectively.

Therefore, one can interpret simulation image I as a set of vectors testing a sequence of local "properties". The "simulation part" of each test is reduced to one implication. This reduction is possible because instead of CNF $F_2$ encoding property ξ, one uses its local "projections".

Generation of Manufacturing Tests

The invention can be applied in the case when only a part of variables of F is "accessible". For example, it may be the case that F describes a circuit and simulation is performed when only input variables of this circuit are available. Values of the remaining variables are implied by the assignments to input variables. The advantage of these test vectors is that they can be used both for functional verification and manufacturing testing. As used herein, such test vectors (i.e. ones in which a part of values is assigned and the rest of values are implied) are referred to as manufacturing test vectors.

Manufacturing test vectors can be derived from a simulation image. To illustrate, let F(X, Z) be a CNF formula encoding a property ξ of a circuit N. Here, X are the variables of F corresponding to the input variables of N while the variables of Z correspond to the internal and output variables of N. Suppose that it is not allowed to set internal variables of N (and hence the variables of Z) to arbitrary values. In this case, the SAT-solver cannot just use points of I as test vectors for the following reason. Let p=(x,z) be a point of the Boolean space $B^{|X|+|Z|}$ where x and z are assignments to the variables X and Z respectively. Since one can make arbitrary assignments only to input variables, one can use only points (x,z) of $B^{|X|+|Z|}$ where values x and z are "consistent". This means that z consists of the values taken by the internal and output variables of N under the input assignment x. Such points are considered consistent. Some points of I may be inconsistent and so cannot be used as manufacturing test vectors. Moreover, it may be the case that a resolvent of R(X, Z) can be falsified only by inconsistent points and so there is no simulation image of R(X, Z) that is comprised only of consistent points.

A way to solve the problem is to build a partial simulation image I' of a resolution proof R(X, Z). Here I' is a simulation image of R(X,Z) from which all inconsistent points are removed. To increase the size of I' (in comparison with the "full" simulation image I) one can use special techniques of deriving resolution proofs. One of them is described below.

The idea is to generate proofs by a known SAT-solver (such as BerkMin) with the following two modifications. First, decision assignments are made only to input variables (i.e variables of X). Second, a conflict clause is generated in such a way that it consists only of variables of X Let R(X,Z) be a proof generated as described above. Then there is a cut of R(X, Z) that contains only nodes corresponding to clauses consisting only of variables of X. The resolvents corresponding to the nodes located above these cut consist only of variables of X. Note that if a clause, e.g. a conflict clause C, consists only of variables of X, a consistent point p=(x,z) falsifying this clause can always be found. (However it may be not true for some clauses involved in the derivation of C.) So each resolution operation corresponding to a node above the cut mentioned above, has a simulation image of consistent points. This guarantees that the partial image obtained from a simulation image I of R(X,Y) contains a substantial part of I so this partial image forms a strong test set.

Example Applications of the Invention a) Using Small Designs for Learning

The invention can be used to study simulation images of resolution proofs generated for small instances of a parameterized design. This is based upon the idea that varying a parameter can change the design size. The accumulated knowledge can be used to generate better tests for larger instances of the same design for which formal proofs are too hard to obtain.

For this example application, let F be a CNF formula describing a property ξ of a small instance of a parameterized design. Let R be a resolution proof that F is unsatisfiable and I be a simulation image of R. One can use I for testing if ξ holds for a larger design as follows. A resolution proof, in a sense, contains a complete set of the "corner cases" to test. So one can try to understand the "semantics" of test vectors of I (i.e. what situations they actually test) and generate similar vectors to test a larger design.

b) Reusing Test Vectors

The invention can be used in a manner in which all or part of test vectors are shared and/or reused. Let F be a CNF formula encoding a property ξ of a circuit N. Suppose a resolution proof R is built that F is unsatisfiable and so ξ holds. Further suppose that some change needs to be introduced in N and it is desired to make sure that the property ξ still holds for the resulting circuit N' without spending too much time.

Let F' be a CNF formula that encodes the property ξ for N'. R cannot be reused to prove that ξ still holds. Nevertheless, one can make use of a simulation image I of R in the following way. Since F and F', in general, have different (but overlapping) sets of variables, the SAT-solver cannot just apply test vectors of I to formula F'. However, for each vector x of I, a vector x' can be generated that inherits all the assignments of x to the variables shared by F and F'. To finish generation of x' one needs to make assignments to the unique variables of F'. This can be done in many ways. The simplest way is to assign the remaining variables randomly. Another possibility is to make the assignments mentioned above in F' (i.e. the assignments of x to the common variables of F and F') and then run a SAT-solver to try to find an assignment satisfying F'. To limit the runtime of this SAT-solver, one can impose a threshold on an internal resource (like the number of backtracks).

The idea of this approach is that if the change introduced in N is "small", then formulas F and F' share many variables and clauses. So, a simulation image of the proof R whose points modified as described above should still have high quality even though it is not "complete" with respect to F'.

c) Using Restriction Clauses

Figure 2:
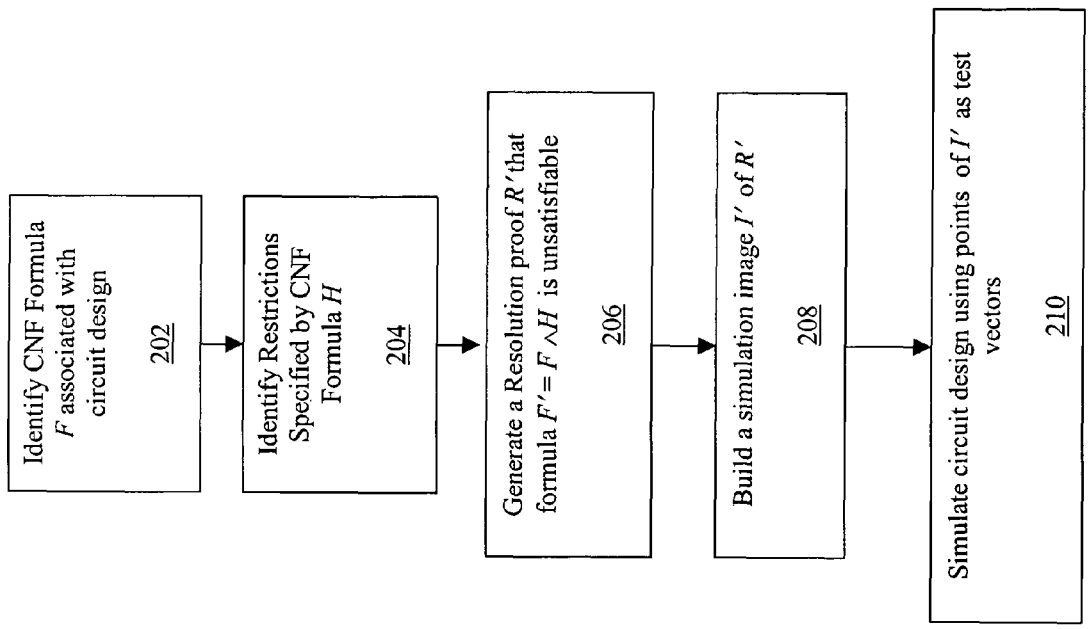
FIG. 2 shows a detailed flowchart of a process for verifying a circuit design in accordance with some embodiments of the invention.

Testing can be performed that uses restriction clauses. FIG. 2 shows a flowchart for this method. At 202, the method identifies a CNF formula F associated with a circuit design, property of the circuit design, or portion of the circuit design. As noted above, the CNF formula F comprises a conjunction of disjunctions of literals associated with the circuit design under examination.

The method considers test generation for a CNF formula F whose unsatisfiability can be proven under some restrictions specified by another CNF H. The method considers the case when proving that F is unsatisfiable is difficult while establishing the unsatisfiability of the formula F ̂ H is feasible. Therefore, at 204, the method identifies restrictions to be applied, which are specified by the CNF formula H.

The effectiveness and efficiency of the test generation procedure may depend on the choice of CNF formula H. Given a CNF formula F, one can view CNF F ̂ H as an "abstraction" of F. Indeed, a clause of H specifies a relation between variables that may be or may be not "implemented" (i.e. implied) by the clauses of F. So one can view adding the clauses of H to F as "approximating" F.

Given a resolution proof that F ̂ H is unsatisfiable, the test generation procedure will try to find an assignment p that falsifies H and satisfies F. In other words, it will try to test the validity of approximation introduced by clauses of H (this approximation is correct only if H is implied by F). If such a test vector exists, then the approximation is wrong and the original formula F is satisfiable. Hence the property described by F does not hold, point p being a counterexample Returning back to FIG. 2, the method next generates a resolution proof R' that the formula F' equal to F ̂ H is unsatisfiable (206). Note that if the formula F' is satisfiable, then the original formula F is satisfiable too and hence the property it describes does not hold. A set of vectors for testing the satisfiability of F is build as a simulation image of a R' (208).

Since it is desired to look for an assignment satisfying F, the process is interested only in the points that falsify H. Indeed, if a point satisfies H, then it has to falsify F because F ̂ H is proven to be unsatisfiable. All nodes of R' can be partitioned into two subsets. Nodes of the first subset (further referred to as "clean") correspond to resolvents derived using only clauses of F. Nodes of the second subset (further referred to as "dirty") correspond to resolvents that were derived using clauses of H. When building a simulation image of R' we can ignore points that falsify resolvents corresponding to "clean" nodes. If a resolvent C is derived only from clauses of F, then it is implied by F. So, any point falsifying C also falsifies F. Note that, given a resolution proof R' and CNF formulas F and H, one can partition the resolvents of R' into "dirty" and "clean" in linear time (in the size of R').

A simulation image I' of proof R' can be build by the procedure find_proof_image$_3$ whose pseudocode is shown below. First, all the nodes of R' are marked as "clean" or "dirty" (line 2). All the "clean" nodes of R' are marked as finished (line 3). Finally, the Find_proof_image$_2$ procedure described above is called (line 5).

//F—CNF formula, H—the restriction CHF formula
//R'—resolution proof that F ̂ H is unsatisfiable.
//I(R')—simulation image of R'. Initially I(R') is empty 1 Find_proof_image$_3$(R',F,H,I(R')){

2 mark_clean_dirty(R',F,H);

3 mark_clean_as_finished(R');

4 Clause=empty; Assgns=∅; F'=F ̂ H

5 Find_proof_image$_2$(R',F',I(R'),Clause,Assgns)

Consider how Find_proof_image$_3$ works on a concrete example. Assume that F is a CNF formula of the following 5 clauses:

$C_1 = x_1 + x_2$
$C_2 = x_2 + {\sim}x_3$
$C_3 = {\sim}x_1 + x_2 + x_3$
$C_4 = {\sim}x_1 + {\sim}x_2$
$C_5 = {\sim}x_2 + {\sim}x_3$.

Figure 4:
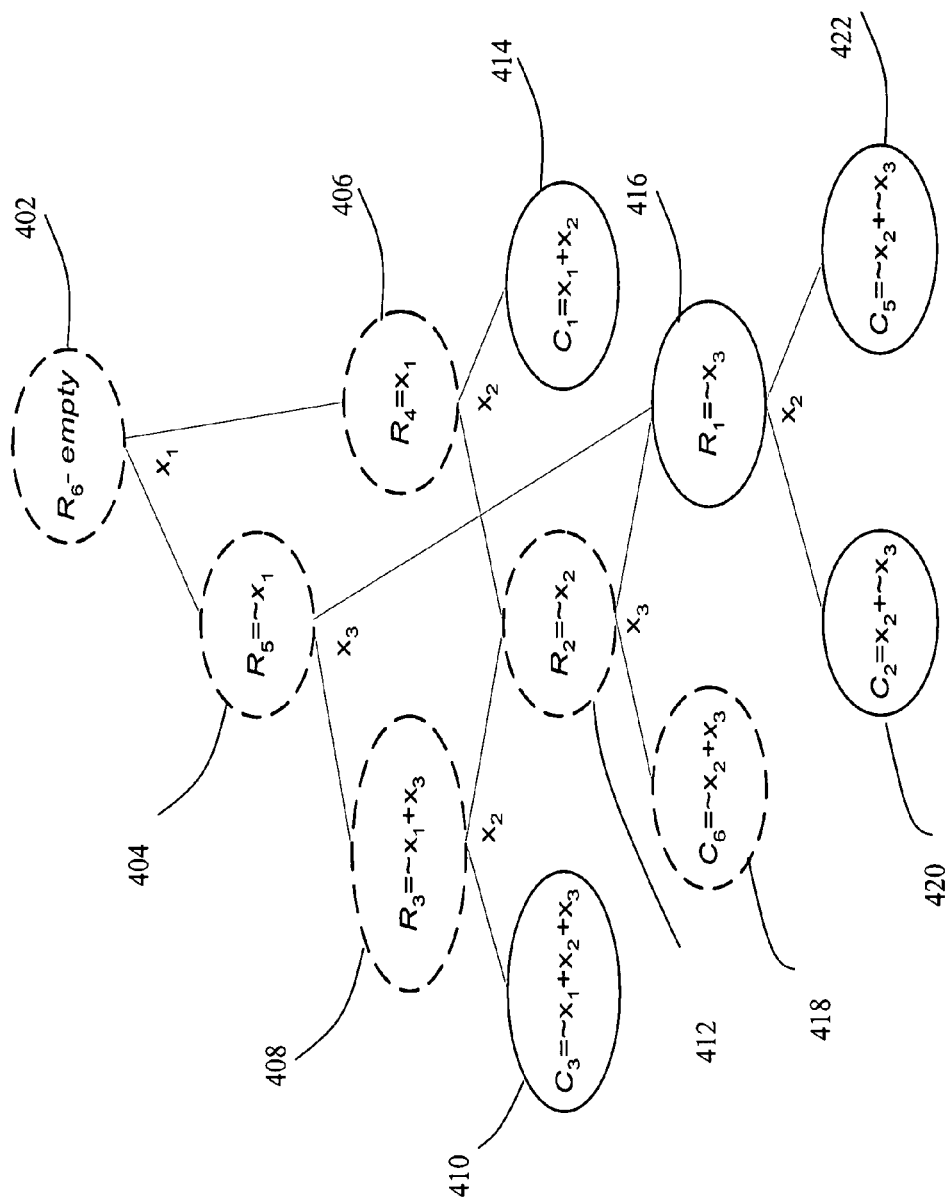
FIG. 4 shows an example resolution graph in accordance with some embodiments of the invention.

In this example, F has only one satisfying assignment ($x_1=0$, $x_2=1$, $x_3=0$). The following describes how this assignment can be found using the find_proof_image$_3$ procedure. In particular, consider the case when H consists of only a single clause $C_6 = x_2 + x_3$. As such, CNF F ̂ H is unsatisfiable and the resolution proof of this fact is shown in FIG. 4.

The nodes of R' are shown after processing them by the mark_clean_dirty procedure. The "dirty" nodes of graph R' are represented by dashed-lined circles. The clean nodes of R' are represented by solid-lined circles. Therefore, the clauses from CNF formula F are represented in the graph of FIG. 4 as solid-lined circles. Clause $C_1$ is represented by circle 414, $C_2$ by circle 420, $C_3$ by circle 410, and $C_5$ by circle 422. The node $R_1$ ($R_1={\sim}x_3$) is represented by a solid-lined circle 416 since it is the child of two "clean" clauses $C_2$ and $C_5$. The restriction clause $C_6$ is represented by a dashed-lined circle 418. Each node that is a child node that is based upon one or more "dirty" nodes is also associated with a dashed-lined circle. Thus, node $R_2$ ($R_2={\sim}x_2$) is associated with dashed-lined circle 412, node $R_3$ ($R_3=x_1+x_3$) is associated with dashed-lined circle 408, node $R_4$ ($R_4=x_1$) is associated with dashed-lined circle 406, node $R_6$ ($R_6$=empty) is associated with dashed-lined circle 402.

It is noted that R does not use the clause $C_4$ of F. The reason is that even though $C_4$ is irredundant in F it is redundant in F ^ H.

All the nodes represented by solid-lined circuits are marked as finished. Then Find_proof_image$_2$ is called. Let us consider how it works in our example. Since node $R_6$ is not marked as finished and is not a clause of F', the parent clauses $R_5$ and $R_4$ of $R_6$ and the variable $x_1$ in which $R_5, R_4$ are resolved are extracted. Then Find_proof_image$_2$ recursively calls itself with Assgns={$x_1$=0} and Clause=$R_4$. Since $R_4$ is not marked as finished and is not a clause of F', then Find_proof_image$_2$ recursively calls itself with Assgns={$x_1$=0, $x_2$=0}, Clause=$C_1$ (after extracting parent clauses of $R_4$ and the variable in which the parent clause are resolved). Since $C_1$ is a "clean" clause, then it is marked as finished and so the current activation of Find_proof_image$_2$ immediately terminates. The previous activation Find_proof_image$_2$ now recursively calls itself with Assgns={$x_1$=0,$x_2$=1} and Clause=$R_2$. Since $R_2$ is not marked as finished and it is not a clause of F', Find_proof_image$_2$ recursively calls itself with Assgns={$x_1$=0, $x_2$=1, $x_3$=0} and Clause=$C_6$. Since $C_6$ is a clause of F', the current assignment ($x_1$=0, $x_2$=1, $x_3$=0) is added to simulation image I(R'). Note that this assignment is satisfying for the CNF formula F. So regardless of what points will be added to I(R') next it will contain an assignment satisfying F.

System Architecture Overview

Figure 5:
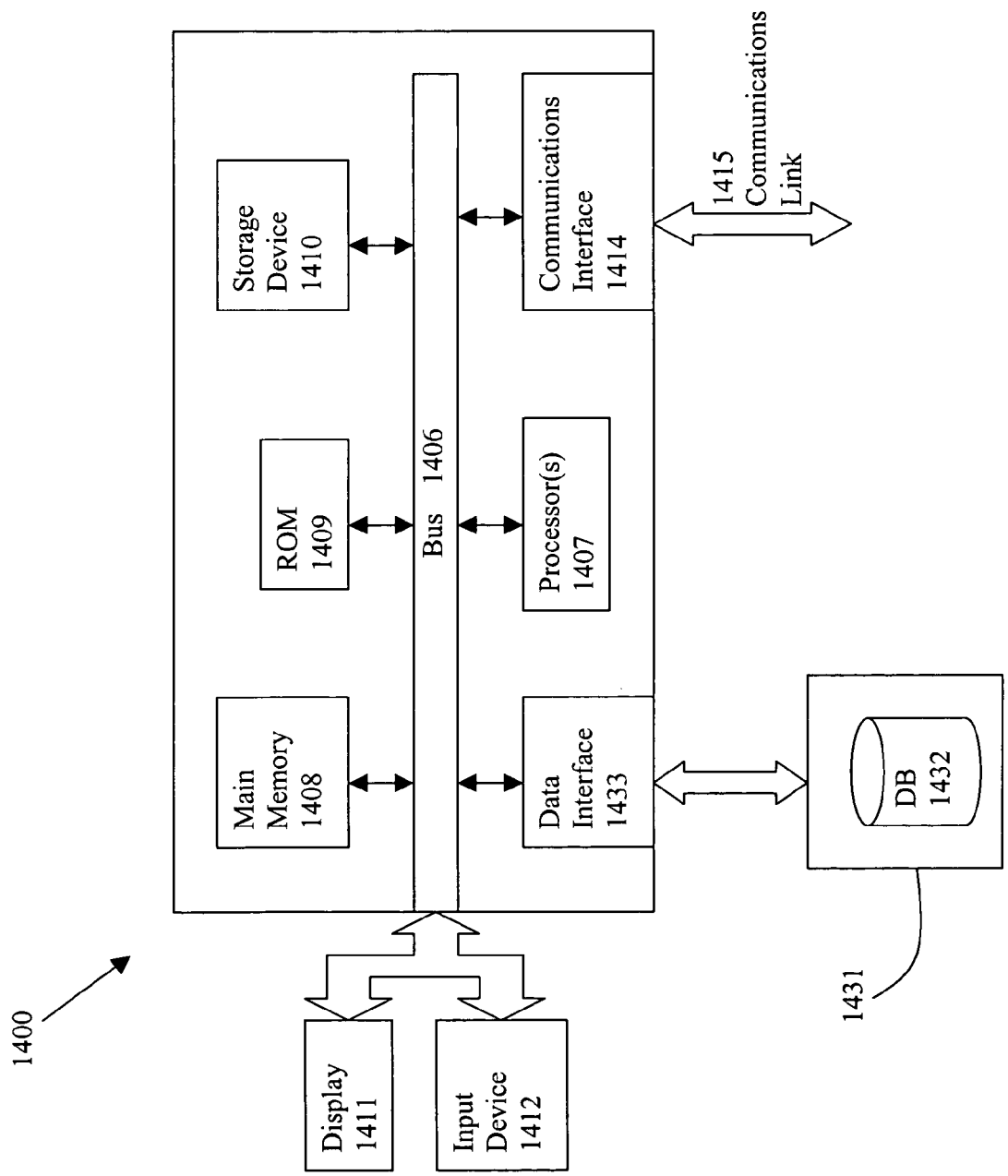
FIG. 5 illustrates an example computing architecture with which embodiments of the invention may be practiced.

FIG. 5 is a block diagram of an illustrative computing system 1400 suitable for implementing an embodiment of the present invention. Computer system 1400 includes a bus 1406 or other communication mechanism for communicating information, which interconnects subsystems and devices, such as processor 1407, system memory 1408 (e.g., RAM), static storage device 1409 (e.g., ROM), disk drive 1410 (e.g., magnetic or optical), communication interface 1414 (e.g., modem or ethernet card), display 1411 (e.g., CRT or LCD), input device 1412 (e.g., keyboard), and cursor control.

According to one embodiment of the invention, computer system 1400 performs specific operations by processor 1407 executing one or more sequences of one or more instructions contained in system memory 1408. Such instructions may be read into system memory 1408 from another computer readable/usable medium, such as static storage device 1409 or disk drive 1410. In alternative embodiments, hard-wired circuitry may be used in place of or in combination with software instructions to implement the invention. Thus, embodiments of the invention are not limited to any specific combination of hardware circuitry and/or software. In one embodiment, the term "logic" shall mean any combination of software or hardware that is used to implement all or part of the invention.

The term "computer readable medium" or "computer usable medium" as used herein refers to any medium that participates in providing instructions to processor 1407 for execution. Such a medium may take many forms, including but not limited to, non-volatile media and volatile media. Non-volatile media includes, for example, optical or magnetic disks, such as disk drive 1410. Volatile media includes dynamic memory, such as system memory 1408.

Common forms of computer readable media includes, for example, floppy disk, flexible disk, hard disk, magnetic tape, any other magnetic medium, CD-ROM, any other optical medium, punch cards, paper tape, any other physical medium with patterns of holes, RAM, PROM, EPROM, FLASH-EPROM, any other memory chip or cartridge, or any other medium from which a computer can read.

In an embodiment of the invention, execution of the sequences of instructions to practice the invention is performed by a single computer system 1400. According to other embodiments of the invention, two or more computer systems 1400 coupled by communication link 1415 (e.g., LAN, PTSN, or wireless network) may perform the sequence of instructions required to practice the invention in coordination with one another.

Computer system 1400 may transmit and receive messages, data, and instructions, including program, i.e., application code, through communication link 1415 and communication interface 1414. Received program code may be executed by processor 1407 as it is received, and/or stored in disk drive 1410, or other non-volatile storage for later execution.

In the foregoing specification, the invention has been described with reference to specific embodiments thereof. It will, however, be evident that various modifications and changes may be made thereto without departing from the broader spirit and scope of the invention. For example, the above-described process flows are described with reference to a particular ordering of process actions. However, the ordering of many of the described process actions may be changed without affecting the scope or operation of the invention. The specification and drawings are, accordingly, to be regarded in an illustrative rather than restrictive sense.

The invention claimed is:

1. A computer implemented method for performing circuit simulation, comprising:
    identifying a circuit design to verify;
    building a set of test vectors of a simulation image off a resolution proof for the circuit design by using at least one processor, wherein
        the set of test vectors is not randomly selected, and
        the resolution proof for the circuit design comprises at least one resolution operation that is used to determine the simulation image;
    performing the circuit simulation of the circuit design by using at least the set of test vectors; and
    storing the set of test vectors in a computer readable storage medium or a computer storage device or displaying the set of test vectors on a display apparatus.

2. A computer implemented method of claim 1 in which a subset of the simulation image of the resolution proof is obtained.

3. A computer implemented method of claim 2 in which the subset of the simulation image is comprised of consistent points.

4. A computer implemented method of claim 1 in which the simulation image of the resolution proof is built by repeating a loop comprising:
    selecting a resolution operation;
    identifying an operation image;
    adding the operation image to the simulation image; and
    returning the simulation image after processing all or substantially all resolution operations.

5. A computer implemented method of claim 1 in which the simulation image of the resolution proof is built by a method comprising:
    recursively traversing a subgraph corresponding to a clause.

6. A computer implemented method of claim 5 in which the clause corresponds to a clause of proof to be processed.

7. A computer implemented method of claim 5 in which if a variable is not yet assigned for the clause, then recursion is applied to extend the assignment for the variable as both 1 and 0.

8. A computer implemented method of claim 1 in which the simulation image of a small instance of a parameterized design is used for generating tests for a larger instance.

9. A computer implemented method of claim 1 in which the simulation image of the resolution proof that a property of a circuit holds is re-used for a modification of the circuit design.

10. A computer implemented method of claim 1 further using restriction clauses.

11. A computer implemented method of claim 1 in which the simulation image of the resolution proof is built for a formula F ˆ H that is unsatisfiable where F is the original formula to be tested for satisfiability and H is a set of restriction clauses.

12. A computer implemented method of claim 11 in which the simulation image is built using a method comprising:
marking nodes of a proof as dirty or clean;
marking clean nodes as finished; and
recursively traversing a subgraph corresponding to the clause to build the simulation image.

13. A computer implemented method of claim 1 in which the test vectors are used for manufacturing tests.

14. A computer implemented method of claim 1 in which the test vectors are used for functional verification.

15. A computer program product that includes a computer readable storage medium, the computer readable storage medium comprising a plurality of computer instructions which, when executed by a processor, cause the processor to execute a process for performing circuit simulation, the process comprising:
identifying a circuit design to verify;
building a set of test vectors of a simulation image off a resolution proof for the circuit design by using at least one processor, wherein
the set of test vectors is not randomly selected, and
the resolution proof for the circuit design comprises at least one resolution operation that is used to determine the simulation image; and
storing the set of test vectors in a computer readable storage medium or a computer storage device or displaying the set of test vectors on a display apparatus.

16. The computer program product of claim 15 in which a subset of the simulation image of the resolution proof is obtained.

17. The computer program product of claim 15 in which the simulation image of the resolution proof is built by repeating a loop comprising:
selecting a resolution operation;
identifying an operation image;
adding the operation image to the simulation image; and
returning the simulation image after processing all or substantially all resolution operations.

18. The computer program product of claim 15 in which the simulation image of the resolution proof is built by a method comprising:
recursively traversing a subgraph corresponding to a clause.

19. The computer program product of claim 15 in which the simulation image of a small instance of a parameterized design is used for generating tests for a larger instance.

20. The computer program product of claim 15 in which the simulation image of the resolution proof that a property of a circuit holds is re-used for a modification of the circuit design.

21. The computer program product of claim 15 further using restriction clauses.

22. The computer program product of claim 15 in which the simulation image of the resolution proof is built for a formula F ˆ H that is unsatisfiable where F is the original formula to be tested for satisfiability and H is a set of restriction clauses.

23. The computer program product of claim 15 in which the test vectors are used for manufacturing tests.

24. The computer program product of claim 15 in which the test vectors are used for functional verification.

25. A system for performing circuit simulation, comprising:
means for identifying a circuit design to verify;
at least one processor of a computer system programmed for building a set of test vectors of a simulation image off a resolution proof for the circuit design, wherein
the set of test vectors is not randomly selected, and
the resolution proof for the circuit design comprises at least one resolution operation that is used to determine the resolution image; and
a computer readable storage medium or a computer storage device configured for storing the set of test vectors or a display apparatus configured for displaying the set of test vectors.

26. The system of claim 25 in which a subset of the simulation image of the resolution proof is obtained.

27. The system of claim 25 in which the simulation image of the resolution proof is built by repeating a loop comprising:
selecting a resolution operation;
identifying an operation image;
adding the operation image to the simulation image; and
returning the simulation image after processing all or substantially all resolution operations.

28. The system of claim 25 in which the simulation image of the resolution proof is built by:
means for recursively traversing a subgraph corresponding to a clause.

29. The system of claim 25 in which the simulation image of a small instance of a parameterized design is used for generating tests for a larger instance.

30. The system of claim 25 in which the simulation image of the resolution proof that a property of a circuit holds is re-used for a modification of the circuit design.

31. The system of claim 25 further using restriction clauses.

32. The system of claim 25 in which the simulation image of the resolution proof is built for a formula F ˆ H that is unsatisfiable where F is the original formula to be tested for satisfiability and H is a set of restriction clauses.

33. The system of claim 25 in which the test vectors are used for manufacturing tests.

34. The system of claim 25 in which the test vectors are used for functional verification.

\* \* \* \* \*